United States Patent
Milesi et al.

(10) Patent No.: US 7,943,402 B2
(45) Date of Patent: May 17, 2011

(54) ION IMPLANTATION PROCESS CHARACTERIZATION METHOD

(75) Inventors: Frédéric Milesi, Sassenage (FR); Frédéric Mazen, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/700,184

(22) Filed: Feb. 4, 2010

(65) Prior Publication Data
US 2010/0197052 A1 Aug. 5, 2010

(30) Foreign Application Priority Data

Feb. 5, 2009 (FR) ...................................... 09 50698

(51) Int. Cl.
*G01R 31/26* (2006.01)
(52) U.S. Cl. ............ 438/17; 438/14; 438/302; 438/370; 438/470; 438/506; 257/E21.531
(58) Field of Classification Search ............... 438/17, 438/302, 369, 370, 470, 440, 473, 506, 514, 438/519, 527, 536
See application file for complete search history.

(56) References Cited

U.S. PATENT DOCUMENTS

| | | | |
|---|---|---|---|
| 7,029,933 B2 * | 4/2006 | Wee et al. | 438/17 |
| 2004/0113147 A1 * | 6/2004 | Tao et al. | 257/48 |
| 2005/0074909 A1 * | 4/2005 | Steeples | 438/17 |
| 2007/0155028 A1 * | 7/2007 | Jang et al. | 438/14 |

OTHER PUBLICATIONS

Smith et al., "Ion Implant Monitoring with Thermal Wave Technology", Appln. Phys. Lett, 47, (6), Sep. 15, 1985, pp. 584-586.
Faifer et al., "Characterization of Ultrashallow Junctions Using Frequency-Dependent Junction Photovoltage and its Lateral Attenuation", Applied Physics Letters 89, 151123, 2006.
Smits, F.M., "Measurement of Sheet Resistivities with Four-Point Probe", The Bell System Technical Journal, May 1958.

* cited by examiner

*Primary Examiner* — Charles Garber
*Assistant Examiner* — Yasser A Abdelaziez
(74) *Attorney, Agent, or Firm* — Pillsbury Winthrop Shaw Pittman, LLP (57) ABSTRACT

A method of characterizing an ion implantation process, the method including a first step of producing a PN junction degraded by the ion implantation of species, the species implantation being obtained by the ion implantation process to be characterized; a second step of measuring a parameter representative of an electrical conduction of the degraded PN junction and a dispersion of the parameter on a surface on which the degraded PN junction is produced, the parameter and the dispersion forming a reference parameter and a reference dispersion, the first and second steps being repeated in time so as to follow the evolution of the parameter representative of electrical conduction with relation to the reference parameter and the dispersion of the representative parameter with relation to the reference dispersion.

12 Claims, 5 Drawing Sheets

Sheet resistance
- 96.1545 - 96.5393
- 95.7697 - 96.1545
- 95.3848 - 95.7697
- 95.0 - 95.3848
- 94.6152 - 95.0
- 94.2304 - 94.6152
- 93.8456 - 94.2304
- 93.4607 - 93.8456
- 93.0759 - 93.4607
- 92.6911 - 93.0759

Fig. 4

Sheet resistance
- 291.9809 - 295.4891
- 288.4727 - 291.9809
- 284.9644 - 288.4727
- 281.4562 - 284.9644
- 277.948 - 281.4562
- 274.4398 - 277.948
- 270.9315 - 274.4398
- 267.4233 - 270.9315
- 263.9151 - 267.4233
- 260.4069 - 263.9151

ION IMPLANTATION PROCESS CHARACTERIZATION METHOD

CROSS-REFERENCE TO RELATED APPLICATIONS

This application is based upon and claims the benefit of priority to French Patent Application No. 09/50698, filed Feb. 5, 2009, the entire contents of which are incorporated herein by reference.

The present invention relates to an ion implantation process characterization method.

In general, the manufacturing of integrated circuits is based on various technological processes such as impurity diffusion, epitaxial growth, etching, oxidation and ion implantation.

The ion implantation process consists of introducing ionized projectile atoms with sufficient energy to penetrate to a certain depth in a target sample (typically a semiconductor wafer) in order to modify the electrical, physical, chemical or optical characteristics of the material forming the target.

Ion implantation is carried out by means of an ion implantation machine, generally composed of:
- a part generating ions from a solid, liquid or gaseous source in an excited plasma (typically between 10 and 100 kV);
- a part selecting ions by a magnetic field sorting by the mass/charge ratio;
- a part accelerating and decelerating ions at a desired implantation energy;
- a part shaping ion beams by electrostatic or electromagnetic lenses;
- an x and y scanning device in order to uniformly implant ions in the wafers.

The best known application for ion implantation processes consists of introducing doping agents or dopant species such as boron, phosphorous, arsenic or $BF_2$ in silicon or nitrogen, aluminum in silicon carbide into semiconductor (for example monocrystalline silicon) wafers by ion bombardment. These doping agents modify the electrical properties of the semiconductor and allow P or N type doped areas to be made. It will be noted that the bombardment of a crystalline semiconductor material by dopant atoms damages the implanted crystalline structure. Therefore it is necessary to restore the crystallinity of the material; this is done by thermal annealing. This thermal annealing also redistributes dopant atoms and therefore modifies the doping profile by diffusion phenomenon. In addition, we note that this annealing also enables the electrical activation of the implanted dopant atoms by their passage to a substitutional site.

Increasing the integration density and manufacturing pace of integrated circuits goes hand in hand with the need for an increasingly rigorous control of ion implantation processes. Thus, the first concern of integrated circuit manufacturers is to quickly detect anomalies and drifts that may appear in implantation machines to avoid wasting semiconductor wafers. In fact, a delay of several hours in the observance of an anomaly may lead to the loss of several dozens, or even hundreds, of silicon wafers, which represents a considerable additional cost.

In practice, the essential parameters for controlling an ion implantation process are ion incident energy, expressed in keV, and dose $\phi$, expressed in ions/cm$^2$. The energy determines the depth of ion penetration. The dose $\phi$ is the number of ions per surface unit received by an implanted wafer. The dose depends on the duration of the implantation cycle and the ion flux, which may be set by measuring the ion current: integration of the current for a well-defined surface over the implantation duration allows the dose to be measured.

Although implantation machines are equipped with various control apparatuses and instruments, experience shows that the proper setting of energy and dose parameters is only really verifiable with an analysis of the result obtained. Thus, diverse control methods have been developed allowing the characteristics of the doped areas to be measured and to correct, if necessary, the initial settings.

The characterization of an ion implantation process consists of following the absolute value of a characteristic measurement of a same process in time (reproducibility of the process) as well as the dispersion of this measurement on several points of the wafer (uniformity of implantation). "Same process" is understood to refer to a method of implanting a determined species with a determined energy in a given material, with a well-defined dose and given tilt, twist, rotation and temperature conditions of the material during implantation. Reproducibility of the measurement must remain within a certain range and uniformity must be less than a certain value. The range and uniformity are predefined by the persons responsible for the ion implantation machines and implantation processes.

A certain number of techniques allowing the ion implantation processes to be characterized are known.

A first known technique consists of measuring the sheet resistance, for example by means of a metal four-point probe or an SPV (Surface Photo Voltage) method. Such a technique is described in the document, "Measurements of sheet resistivity with the four-point probe" (F. M. Smits BSTJ—1958—p371). This is an on-line technique, in several points of the wafer, that is non-destructive and rapid (approximately 1 min. to perform the measurement). For reference, the four-point method utilizes two points that are used for supplying current, the other two points being used for measuring the potential.

However, following the implantation to be characterized, this technique necessitates thermal annealing of the wafer to be performed to set the species present in the substrate.

Once the wafer has undergone the thermal treatment, then numerous points in the wafer are analyzed by a four-point resistance analyzer conventionally providing an indication of the sheet resistance of the area studied.

In addition, this method of characterizing implantation by measuring sheet resistance presents an important limitation since it only allows the implantation of dopant species to be characterized. Therefore, it is not adapted for the characterization of a process to implant non-dopant species (for example, light species such as hydrogen or helium). Such being the case, the evolution of electronic components and materials has led to the use of ion implantation processes for applications other than making doped areas, particularly with implanted species that are not dopant species. By way of example, one may cite the implantation of:
- hydrogen or helium in the case of layer transfer processes, for example the SMARTCUT™ process for manufacturing SOI (Silicon On Insulator) material;
- germanium or silicon to preamorphize a semiconductor material such as silicon or germanium;
- oxygen for the SIMOX (Separation by Implantation of OXygen) process;
- carbon, fluorine or nitrogen to reduce the dopant diffusion effect during annealing.

A known solution allowing implantation processes to be characterized without the need for thermal annealing (ionic implantation called "as implanted") and for all species (i.e., not necessarily dopant species) consists of utilizing the technique known as SIMS (Secondary Ion Mass Spectrometry).

Such a technique described in the document, "Secondary Ion Mass Spectrometry: Basic concepts, instrumental aspects, applications, and trends" (A. Benninghoven, F. G. Rüdenauer, H. W. Werner—Wiley-Intersciences—1987) consists of analyzing the areas implanted by mass spectrometry.

However, this method is not without disadvantages. Thus, this method necessitates the prior abrasion of the parties to be analyzed and, consequently, is destructive.

In addition, this is an off-line technique, carried out at a single point on the wafer.

It also necessitates a certain production time (approximately 1 day) and expertise in carrying out and analyzing the measurements. This slowness in implementation (linked to both the performance and analysis) therefore leads to a high cost.

Another method, known by the name "thermal wave" or THERMAWAVE™, consists of analyzing the temperature of an implanted area excited by a laser beam. A description of this method will be found in the document "Ion implant monitoring with thermal wave technology" (W. Lee Smith and al.—Appl. Phys. Lett. 47(6)—1985—p584). This is an on-line technique that is non-destructive and rapid (approximately 1 min.) and in several points of the wafer. This method also presents certain disadvantages.

Thus, the results obtained are dimensionless values that must be correlated with other results to control the evolution of the value.

In addition, this method requires a complex and costly apparatus and there is no general consensus regarding its non-destructive character, as some consider that the heating of tested areas brings about silicon annealing.

In this context, the object of the present invention is to provide a method to characterize an ion implantation process without annealing (i.e., "as implanted") allowing the characterization of any type of implanted species from the periodic table, in particular non dopant species, said method being able to be implemented on-line, in several points of the wafer and also being non-destructive, rapid and inexpensive.

To this end, the invention proposes a method to characterize an ion implantation process characterized in that the method comprises:

a first step of producing a PN junction degraded by the ion implantation of species, said species implantation being obtained by said ion implantation process to be characterized;

a second step of measuring a parameter representative of the electrical conduction of said degraded PN junction and the dispersion of said parameter on the surface on which said degraded PN junction is produced, said parameter and said dispersion forming a reference parameter and dispersion;

Said first and second steps being repeated in time so as to follow the evolution of the parameter representative of electrical conduction with relation to said reference parameter and of the dispersion of the representative parameter with relation to said reference dispersion.

Thanks to the invention, one advantageously utilizes a PN junction voluntarily degraded by the implantation process that the invention seeks to be characterized. "Degraded PN junction" is understood to refer to a PN junction in which electrical conduction is reduced with relation to a PN junction obtained under the same conditions as the degraded PN junction but without ion species implantation by the ion implantation process to be characterized.

It will be noted that the method according to the invention does not necessitate annealing after implantation (i.e., it is an "as implanted" implantation).

The method according to the invention allows all species from the periodic table and their associated molecules, including non dopant species, to be characterized, whatever the energy, dose, tilt, twist, rotation number and temperature of the implantation substrate in all semiconductor materials. The characterization will be done by measuring and following over time a parameter representative of the electrical conduction of the degraded PN junction such as its sheet resistance, resistivity or mobility. In addition, the method is rapid and may be implemented on-line and in any point of the wafer on which the PN junction is produced.

The method according to the invention does not introduce any additional cost with relation to the equipment already present in clean rooms in the microelectronics sector since it is possible to utilize, for measuring the parameter representing the electrical conduction of the degraded PN junction, conventional ion implantation characterization tools such as the four-point measuring probe or an SPV (Surface Photo Voltage) apparatus.

The method according to the invention may also present one or more of the characteristics below, considered individually or according to all technically possible combinations:

said parameter representing electrical conduction is sheet resistance;

the mean species implantation depth is substantially equal to the depth of said degraded PN junction;

the concentration of implanted species according to said ion implantation process to be characterized is strictly less than the concentration of dopants able to perform P or N doping in the implantation area;

the substrate on which said PN junction is produced is an N type substrate;

the dopants able to perform P doping in the implantation area are boron atoms;

said step of producing a degraded PN junction comprises the following steps:

producing a non-degraded PN junction and then;

implantation of species obtained by said ion implantation process to be characterized in said non-degraded PN junction;

said non-degraded PN junction is produced by one of the following processes:

ion implantation, in a substrate doped according to a first type of P or N doping, of dopants able to make a second type of doping that is opposite from said first doping type and then thermal annealing to activate the implanted dopant atoms;

deposition by epitaxy, on a substrate doped according to a first type of P or N doping, of a layer doped according to a second type of doping that is opposite from said first doping type;

diffusion, in a substrate doped according to a first type of P or N doping, of dopant atoms according to a second type of doping that is opposite from said first doping type;

the characterization method according to the invention comprises a step of measuring a parameter representative of the electrical conduction of said non-degraded PN junction identical to said parameter representative of the electrical conduction of said degraded PN junction;

said step of producing a degraded PN junction comprises the following steps:

ion implantation, in a substrate doped according to a first type of P or N doping, of dopants able to make a second type of doping that is opposite from said first doping type and then;

ion implantation of said species according to said ion implantation process to be characterized and then;

thermal annealing to activate the implanted dopant atoms;

said step of producing a degraded PN junction comprises the following steps:

ion implantation, in a substrate doped according to a first type of P or N doping, of said species according to said ion implantation process to be characterized and then;

ion implantation of defects able to perform a second type of doping opposite from said first type of doping and then;

thermal annealing to activate the implanted dopant atoms. Other characteristics and advantages of the invention will clearly emerge from the description given below, for indicative and in no way limiting purposes, with reference to the attached figures, among which:

In all figures, common elements bear the same reference numbers.

The purpose of the method according to the invention is to characterize an ion implantation process. The implanted incident ions will lose their energy by successive impacts with crystal lattice atoms. After impact, the projectiles take directions statistically distributed along all directions. Logically, the energy lost remains statistically lower than the total energy and the ion continues to progress in its implantation direction despite a deviation of the trajectory. At the end of the course, when the kinetic energy is much weaker, the ions are confined in a restricted space due to strong bonds between atoms. This explains, first, the dispersion of trajectories and, second, that a mean penetration depth $Rp_{caract}$ is statistically defined. As a first approximation, the statistical profile of the concentration N(x) of species implanted as a function of the implantation depth x is a Gaussian profile given by the following formula:

$$N(x) = C_{caract} \cdot \exp\left(\frac{(x - Rp_{caract})^2}{2\Delta Rp_{caract}^2}\right),$$

where $Rp_{caract}$ is the mean penetration depth, $\Delta Rp_{caract}$ is the standard deviation and $C_{caract}$ is the maximum concentration at mean penetration depth.

In addition to the type of species, energy and dose, an implantation process is also defined by the tilt, twist, wafer rotation number and implantation wafer temperature parameters and the material in which implantation will be carried out. Tilt corresponds to the angle between the incident ion beam and the normal to the surface of the wafer to be implanted and twist corresponds to the angle of rotation of the wafer in its plane.

Thus, a mean penetration depth $Rp_{caract}$ and a maximum concentration at mean penetration depth $C_{caract}$ correspond to a given implantation process to be characterized (given species, energy, dose, tilt, twist, rotation number, implantation temperature substrate and material in which implantation will take place).

FIGS. 1a to 1e illustrate the steps of a first embodiment of the characterization method according to the invention.

FIG. 1 shows that the invention starts with a wafer 1 forming a blank substrate. This substrate is made in a semiconductor material, advantageously an N type material, for example an N type silicon substrate.

Figure 1A:
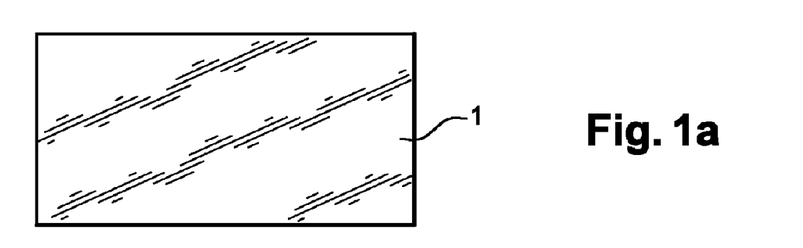
FIGS. 1a to 1e illustrate the steps of a first embodiment of the characterization method according to the invention.
Figure 1B:
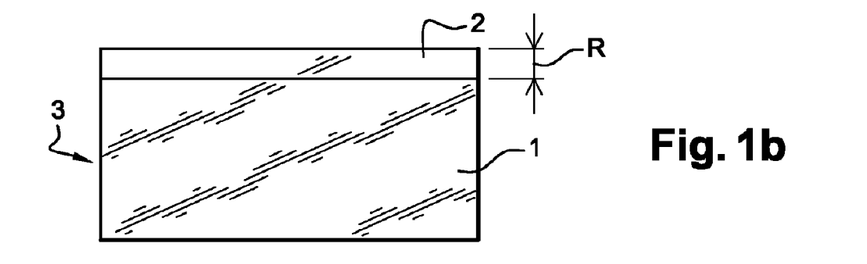

FIG. 1b illustrates the embodiment, from N-doped wafer 1 of P-doped area 2, such that a PN junction is formed.

As mentioned above, the implantation process that the invention seeks to be characterized is particularly defined by a mean penetration depth $Rp_{caract}$ and a maximum concentration at mean penetration depth $C_{caract}$.

According to a particularly advantageous embodiment, to characterize this process, it is preferable that the maximum concentration at mean penetration depth $C_{caract}$ is strictly less than the concentration $C_{junction}$ of P type dopants of area 2: $C_{caract} < C_{junction}$. Condition 1 will designate this first condition.

In addition, advantageously, it is also preferable that the mean penetration depth $Rp_{caract}$ be substantially equal to the depth R of the electrical junction. Condition 2 will designate this second condition. "Depth of the electrical junction" is understood to refer to the thickness of the P-doped area 2.

P-doped area 2 may for example be made by ion implantation of P type dopant species (for example elements from column III of the periodic table, such as boron B, gallium Ga or indium In in a semiconductor material from column IV, such as silicon Si). According to a preferential embodiment, for questions of the physical limitations of implantation machines, boron is used here as a P type dopant for producing area 2. As already mentioned above, the sensitivity of the characterization method according to the invention is better if the mean species implantation depth to be characterized $Rp_{caract}$ is substantially equal to the depth R of the electrical junction. Mean implantation depth is a function of the implantation energy and mass of the species implanted. The heavier the atom, the more energy needed to deeply implant the atom. Ion implantation machines are physically limited in accelerating voltage (typically 250 kV). In order to be able to characterize all implantation processes, it is thus advantageous to perform the implantation of the electrical junction PN with the lightest dopant element (i.e., Boron). As boron is a P type doping element, it will therefore be more advantageous to perform P dopant implantation on an N type substrate to produce the PN junction.

In the case of making area 2 by ion implantation, it is then possible to determine by dichotomy the mean penetration depth $Rp_{junction}$ corresponding to the implantation of P type dopant species such that this mean penetration depth $Rp_{junction}$ is substantially equal to the mean penetration depth $Rp_{caract}$ of the implantation process to be characterized (respect condition 1 mentioned above with R=$Rp_{junction}$) by using computer simulation software (for example, SRIM or Crystal-TRIM software). Once this mean penetration depth $Rp_{junction}$ is determined, this same simulation software enables the P type dopant species implantation dose to be defined so that the maximum concentration $C_{junction}$ (corresponding to the mean penetration depth $Rp_{junction}$) is greater than the maximum concentration $C_{caract}$ of the implantation process to be characterized.

Once implantation is carried out, the crystallinity of the material should be restored; this is done by thermal annealing. This thermal annealing also redistributes dopant atoms and therefore modifies the doping profile by diffusion phenomenon. In addition, we note that this annealing also enables the electrical activation of the implanted dopant atoms by their passage to a substitutional site.

It will be noted that P-doped area 2 may also be obtained by other techniques:

Therefore, P-doped area 2 may be made by epitaxy; in other words, a P-doped layer is grown (forming area 2) on substrate 1. The three large epitaxy categories may be utilized for this purpose:

molecular beam epitaxy or MBE;
liquid phase epitaxy or LPE;
chemical vapor deposition epitaxy or CVD epitaxy.

P-doped area 2 may also be made via a diffusion process; to do this, substrate 1 is placed in contact with P type dopant atoms that will be activated by heating. Three large source types may be utilized to provide doping elements that one wishes to penetrate into the substrates; gaseous, liquid or solid sources.

Of course, whether P-doped area 2 is obtained by epitaxy or diffusion, it is also preferable that conditions 1 and 2 be respected.

At this stage of the method according to the invention, we are therefore in the presence of a PN junction 3.

It will be noted that, even if the invention is preferentially applied by producing the PN junction by implanting P dopants (typically boron) in an N type substrate, the method according to the invention also applies by reversing the P and N dopings by starting with a P type substrate and making an N area by one of the processes described above. In this case, elements from column V (phosphorous, arsenic, antimony, etc.) will be utilized to carry out N type doping in a P type silicon substrate.

Figure 1C:
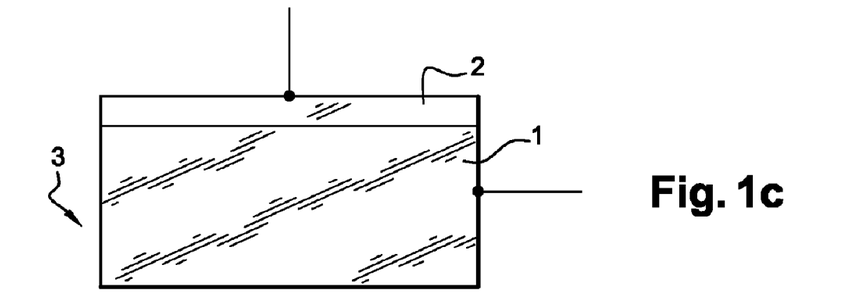

FIG. 1c illustrates a step of measuring a parameter representative of the electrical conduction of PN junction 3. This representative parameter is preferentially sheet resistance with the dispersion of said resistance on the wafer surface. The sheet resistance, expressed in ohm/square, and its dispersion may be, for example, obtained, in a known manner, by a 4-point method or an SPV (Surface Photo Voltage) method. It will be noted that it is also possible to measure, instead of sheet resistance, the resistivity (expressed in Ohm.cm and obtained by a 4-point method or an SPV method) or the mobility (expressed in $cm^2/V.s$ and obtained, for example, by a Hall effect technique) of junction 3.

In order to obtain the best possible interpretation of results obtained by the method according to the invention, it is preferable that PN junction 3 be produced with good uniformity on the base wafer 1. "Good uniformity" is understood to refer to sheet resistance, resistivity or mobility dispersion that must be the lowest possible dispersion.

Figure 1D:
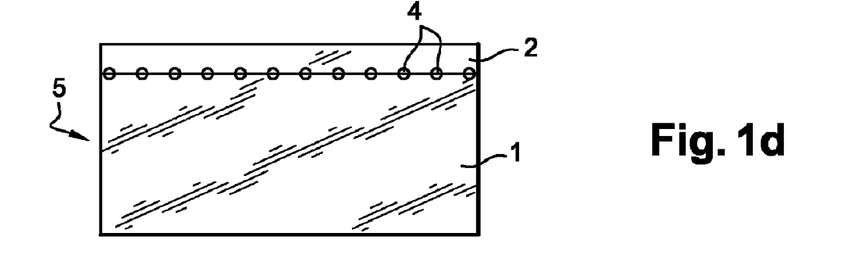

FIG. 1d illustrates a step of implanting species 4 into P-doped area 2 of PN junction 3 such as represented in FIGS. 1b and 1c. This implantation is carried out by the ion implantation process that the invention seeks to be characterized. The implantation will lead to electrical degradation of area 2: the bombardment of implanted species within area 2 in a crystalline semiconductor material will induce damages in the crystalline structure and a displacement of P-type dopant atoms, some passing from a substitutional site to an interstitial site; this implantation therefore allows a PN junction 5 to be produced that is degraded in terms of electrical conduction with relation to the initial PN junction 3. Consequently, the implantation carried out by the process to be characterized effectively involves an increase in sheet resistance, resistivity or mobility of the degraded PN junction 5 with relation to the sheet resistance, resistivity or mobility of the initial PN junction 3. More generally, it will be noted that the species implantation step 4 may be carried out anywhere in the non-degraded PN junction 3 (i.e., in the P-doped area 2 of the PN junction, in the N-doped area 1 or spanning areas 1 and 2, respectively N-doped and P-doped).

Figure 1E:
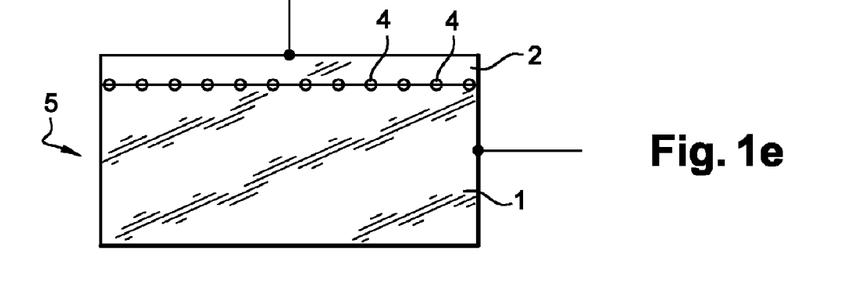

In that capacity, FIG. 1e illustrates a step of measuring, for the degraded PN junction 5, the same parameter representative of electrical conduction as that measured for the initial PN junction 3 (FIG. 1c). This representative parameter is preferentially sheet resistance with the dispersion of said resistance on the wafer surface. This measurement allows a reference value (as well as the dispersion of this value on the wafer) of the degraded PN junction 5 to be obtained.

Typically, a plurality of wafers with initial PN junctions 3 produced under similar conditions (FIG. 1a to FIG. 1c) are created. At the time of reference, one of these wafers is degraded (FIG. 1d) by the implantation process that the invention seeks to be characterized. The sheet resistance of this first wafer as well as its dispersion are then measured (FIG. 1e). This measurement thus constitutes the reference value of degraded PN junction 5 (the dispersion of this value on the wafer is also a reference value). It will be noted that the characterization method according to the invention applies to any type of implanted species and not exclusively to dopant species.

As the objective is to characterize the implantation process, the degradation and measurement step is repeated on another wafer at a time after the reference time (typically 1 day or 1 week later depending on the characterization frequency of the implantation process to be characterized). The new measurement of sheet resistance and dispersion on the degraded PN junction allows the evolution of sheet resistance and its dispersion to be followed in time with relation to the reference sheet resistance and dispersion. Reproducibility of the measurement must remain within a certain range and uniformity must be less than a certain value. A deviation that is too large with relation to the reference values indicates a problem with the setting of one of the implantation parameters of the process to be characterized.

Figure 4:
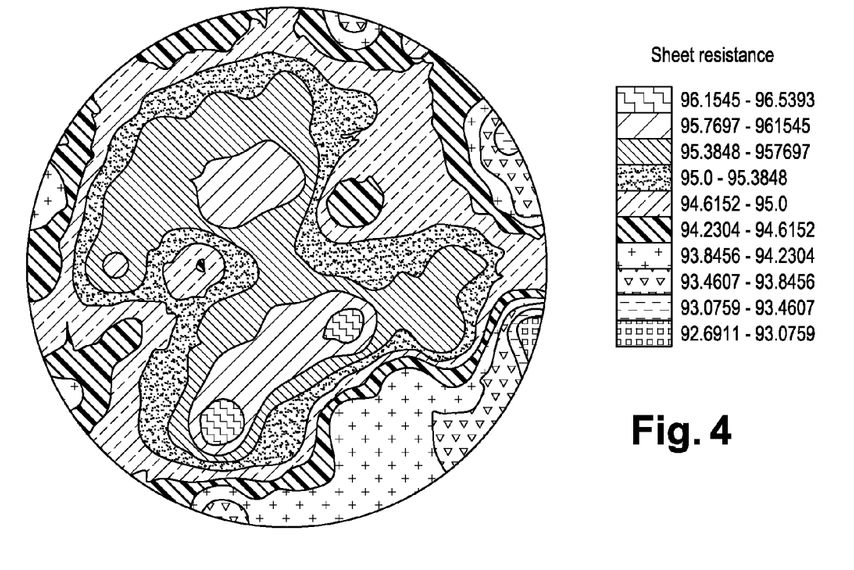
FIGS. 4 to 6 illustrate a practical implementation of the characterization method according to the invention.
Figure 5:
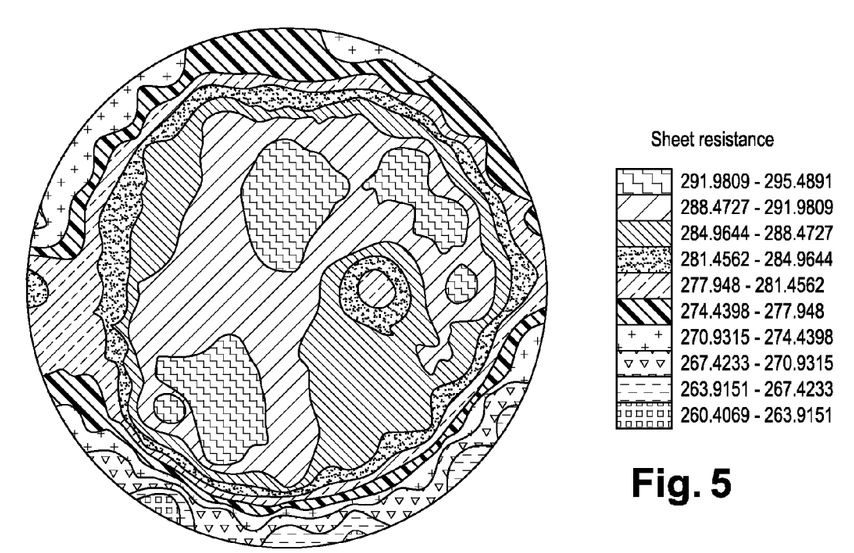
Figure 6:
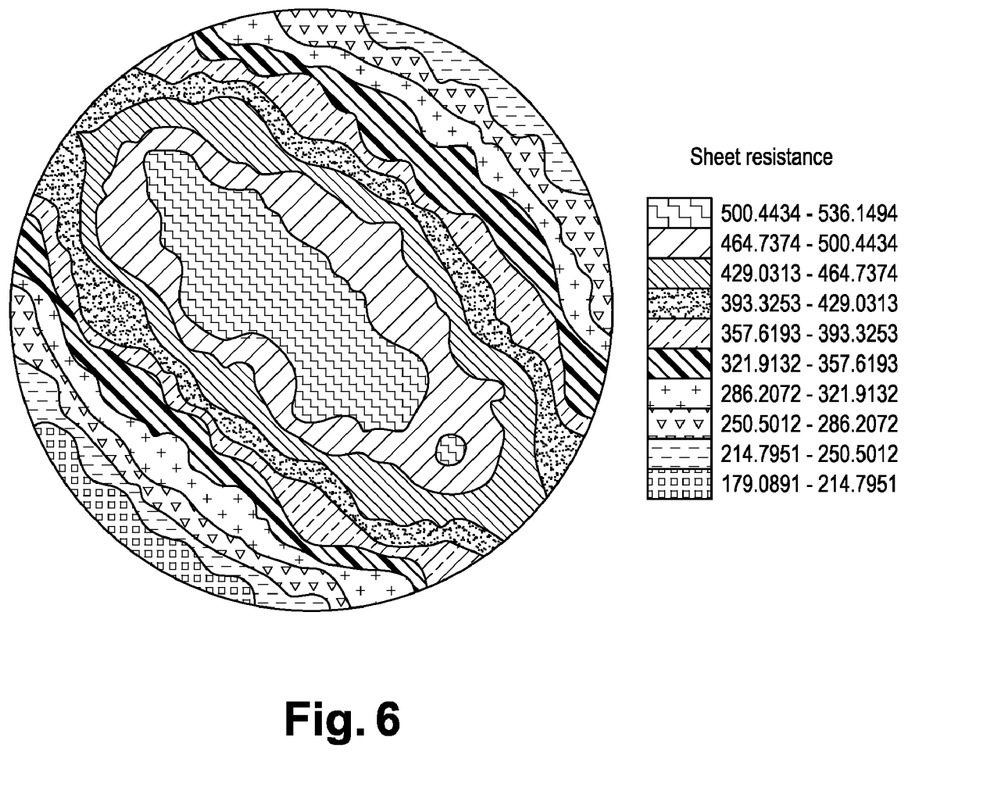

FIGS. 4 to 6 illustrate this phenomenon by a practical implementation of the characterization method according to the invention. In this case, the invention seeks to characterize a process of implanting H+ (a species that is not dopant in silicon) ions at an energy of 90 keV and a dose of $10^{15}$ at.$cm^{-2}$. The utilization of SRIM or Crystal-TRIM type computer simulation software produces a mean penetration depth $Rp_{caract}$ of the implantation process to be characterized approximately equal to 800 nm and a maximum concentration $C_{caract}$ corresponding to mean penetration depth approximately equal to $5.10^{20}$ at.$cm^{-3}$.

FIG. 4 represents mapping of the sheet resistance on a wafer comprising an initial PN junction such as the PN junction 3 represented in FIG. 1b. The mapping represents different areas of the wafer corresponding to different sheet resistance value intervals expressed in ohm/square. This PN junction is produced by implanting boron in an N-doped silicon substrate followed by dopant activation annealing. Still by means of SRIM or Crystal-TRIM type software, the mean penetration depth $Rp_{junction}$ corresponding to the implantation of boron is determined by dichotomy such that this mean penetration depth $Rp_{junction}$ is substantially equal to the mean penetration depth $Rp_{caract}$ (i.e., to obtain a value of $Rp_{junction}$ that is substantially equal to 800 nm). To this end, an implantation energy value of boron approximately equal to 250 keV is obtained. Once the implantation energy is determined, this same simulation software enables the P type dopant species implantation dose to be defined so that the maximum concentration $C_{junction}$ (corresponding to the mean penetration depth $Rp_{junction}$) is greater than the maximum concentration $C_{caract}$ of the implantation process to be characterized. Typically, to have a maximum boron concentration $C_{junction}$ (corresponding to the mean penetration depth $Rp_{junction}$ of 800 nm) on the order of $5.10^{21}$ at.cm$^{-3}$ (or a factor 10 with relation to the concentration $C_{caract}$) an implantation dose of $10^{16}$ at.cm$^{-2}$ for boron at 250 keV is utilized.

The initial PN junction thus produced has a mean sheet resistance of 95 ohm/square with on-wafer dispersion of 0.91%.

FIG. 5 represents a mapping of sheet resistance on a wafer comprising a degraded PN junction with relation to the PN junction whose mapping is represented in FIG. 4. The degraded wafer is obtained by the implantation process to be characterized (therefore by implanting H+ ions at an energy of 90 keV and a dose of $10^{15}$ at.cm$^{-2}$).

The PN junction thus degraded passes to a mean sheet resistance value equal to 280 ohm/square with an on-wafer dispersion of 3.72%: These values constitute reference values in which evolution will be followed in time. Of course, an increase in the sheet resistance and dispersion of this degraded PN junction is observed with relation to the initial PN junction.

FIG. 6 represents a mapping of the sheet resistance on a wafer comprising a degraded PN junction with relation to the PN junction whose mapping is represented in FIG. 4. The degraded wafer is obtained by the implantation process to be characterized (therefore by implanting H+ ions at an energy of 90 keV and a dose of 1015 at.cm-2). The experimental conditions for obtaining this degraded junction are identical to those utilized for producing the PN junction described with reference to FIG. 5 with the exception of the horizontal scanning of the ion beam of the wafer modified so as to make the implantation non-uniform.

The PN junction thus degraded passes to a mean sheet resistance value equal to 364 ohm/square with an on-wafer dispersion of 29.47%. Therefore, an appreciable increase of the measured dispersion with relation to the reference dispersion equal to 3.72% is observed. Therefore, a modification of a setting parameter, such as scanning, is immediately detected by a substantial variation with relation to the reference values.

FIGS. 2a to 2e illustrate the steps of a second embodiment of the characterization method according to the invention.

Figure 2A:
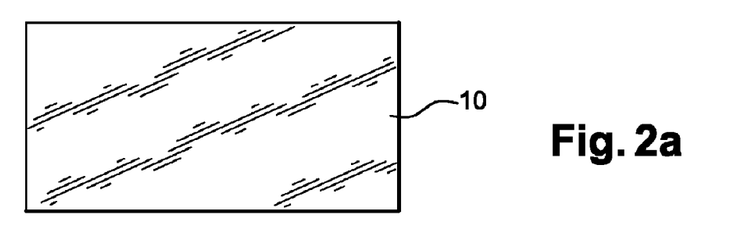
FIGS. 2a to 2e illustrate the steps of a second embodiment of the characterization method according to the invention.

FIG. 2a shows that the invention starts with a wafer 10 forming a blank substrate. This substrate is made in a semiconductor material, advantageously an N type material, for example an N type silicon substrate.

Figure 2B:
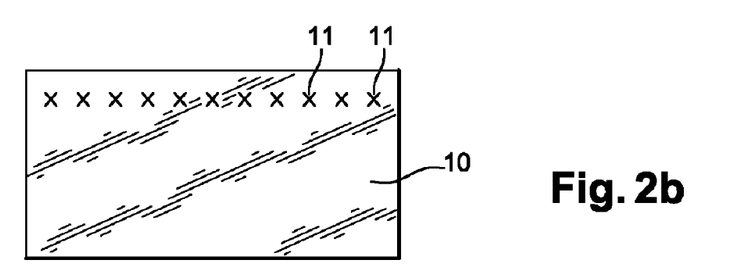

FIG. 2b illustrates the embodiment, from N-doped wafer 10, of an implantation of dopants 11 able to form P doping (typically an implantation of B, Ga or In in silicon).

As mentioned above, the implantation process that the invention seeks to be characterized is particularly defined by a mean penetration depth $Rp_{caract}$ and a maximum concentration at mean penetration depth $C_{caract}$.

By means of SRIM or Crystal-TRIM type computer simulation software, the mean penetration depth $Rp_{junction}$ corresponding to the implantation of species able to perform P type doping is determined by dichotomy such that this mean penetration depth $Rp_{junction}$ is substantially equal to the mean penetration depth $Rp_{caract}$ of the implantation process to be characterized (respect of condition 1 described above). Once this mean penetration depth $Rp_{junction}$ is determined, this same simulation software enables the implantation dose of species able to carry out P type doping to be defined such that the maximum concentration $C_{junction}$ (corresponding to the mean penetration depth $Rp_{junction}$) is greater than the maximum concentration $C_{caract}$ of the implantation process to be characterized.

It will be noted that the method according to the invention applies just as much by reversing the P and N dopings by starting with a P type substrate and by making an area implanted by dopants able to carry out N doping.

Figure 2C:
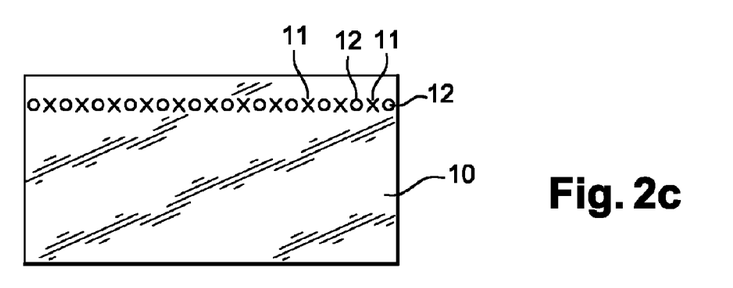
Figure 2D:
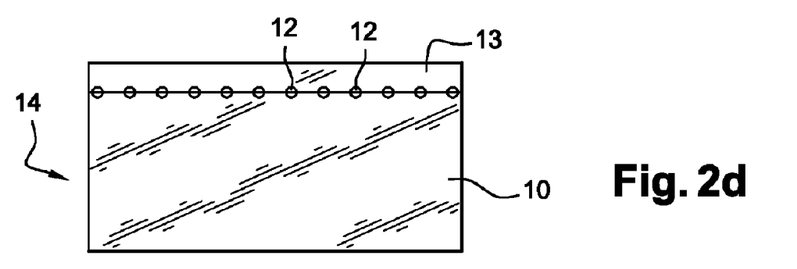

FIG. 2c illustrates a step of implanting species 12 in the area already implanted by dopants 11. This implantation is carried out by the ion implantation process that the invention seeks to characterize.

Figure 2E:
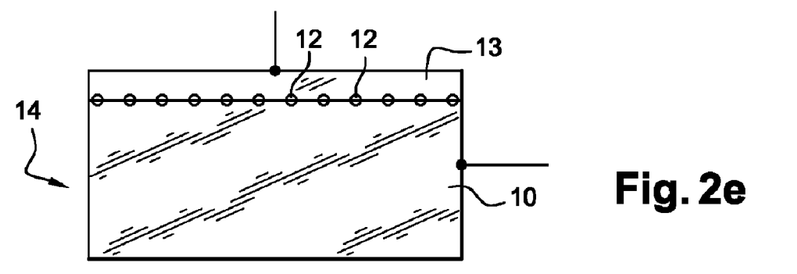

Once this double implantation is performed (FIGS. 2b and 2c), the crystallinity of the material should be restored; this is carried out by the thermal annealing illustrated in FIG. 2e. This thermal annealing also enables a redistribution of dopant atoms implanted during the step illustrated in FIG. 2b and therefore a modification of the doping profile by diffusion phenomenon. In addition, we note that this annealing also enables the electrical activation of the implanted dopant atoms by their passage to a substitutional site. Thanks to this annealing, a P type area 13 is obtained. This area 13 is, however, degraded by the presence of implanted species 12 that reduce the opportunities to place dopants 11 (that remain in the interstitial site) carrying out P doping in the substitutional site. Contrary to the first embodiment described with reference to FIGS. 1a to 1e, it will be noted that a degraded PN junction 14 is obtained here without going through producing an initial PN junction; this is due to the fact that the double implantation is carried out before the annealing activating the dopant species. However, this PN junction 14 remains a degraded PN junction with relation to the same PN junction obtained without species implantation by the process to be characterized. This degradation phenomenon effectively involves an increase in sheet resistance, resistivity or mobility of the degraded PN junction 14 with relation to the sheet resistance, resistivity or mobility of a PN junction obtained without species implantation by the process to be characterized.

FIG. 2e illustrates a step of measuring, for the degraded PN junction 14, a parameter representative of electrical conduction (typically sheet resistance with dispersion of said resistance on the surface of the wafer). This measurement allows a reference value (as well as the dispersion of this value on the wafer) of the degraded PN junction 14 to be obtained.

Typically, a plurality of wafers implanted by species 11 under similar conditions (FIG. 2a and FIG. 2b) are created. At the time of reference, a degraded PN junction (FIG. 2c and FIG. 2d) is produced on one of these wafers by the implantation process that the invention seeks to characterize followed by annealing. The sheet resistance of this first wafer as well as its dispersion are then measured (FIG. 2e). This measurement thus constitutes the reference value of the degraded PN junction 14 (the dispersion of this value on the wafer is also a reference value). It will be noted that the characterization method according to the invention applies to any type of implanted species and not exclusively to dopant species.

As the objective is to characterize the implantation process, the degradation and measurement step is repeated on another wafer at a time after the reference time (typically 1 day or 1 week later depending on the characterization frequency of the implantation process to be characterized). The new measurement of sheet resistance and dispersion on the degraded PN junction allows the evolution of sheet resistance and its dispersion to be followed in time with relation to the reference sheet resistance and dispersion. A deviation that is too large with relation to the reference values indicates a problem with the setting of one of the implantation parameters of the process to be characterized.

FIGS. 3a to 3e illustrate the steps of a third embodiment of the characterization method according to the invention. This third embodiment is very close to the second embodiment illustrated with reference to FIGS. 2a to 2e, the only difference consisting of reversing the two implantation steps.

Figure 3A:
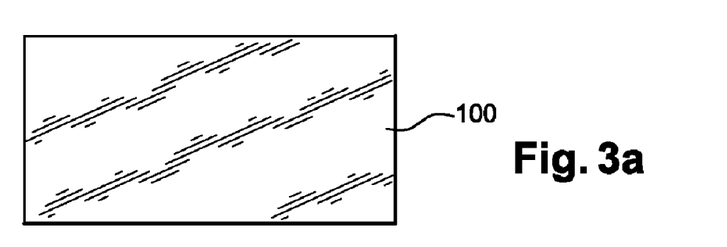
FIGS. 3a to 3e illustrate the steps of a third embodiment of the characterization method according to the invention.

FIG. 3a shows that the invention starts with a wafer 100 forming a blank substrate. This substrate is made in a semiconductor material, advantageously an N type material, for example an N type silicon substrate.

Figure 3B:
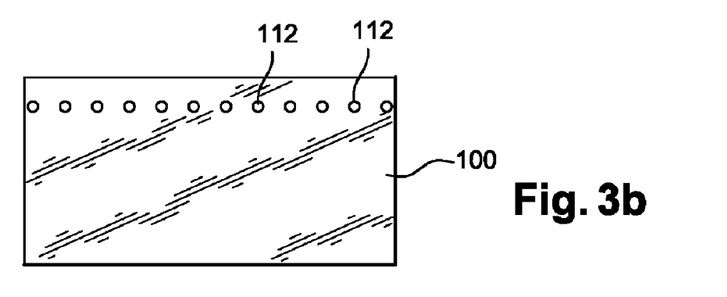

FIG. 3b illustrates a step of implanting species 112 in substrate 100. This implantation is carried out by the ion implantation process that the invention seeks to characterize.

Figure 3C:
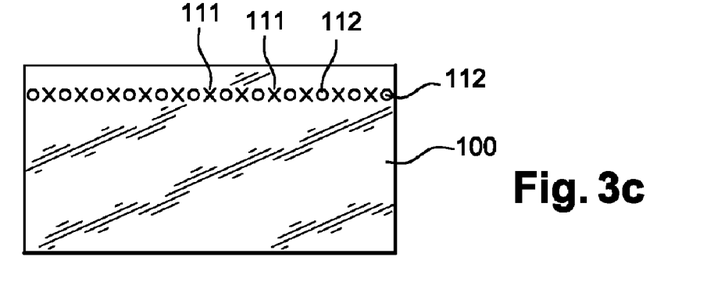
Figure 3D:
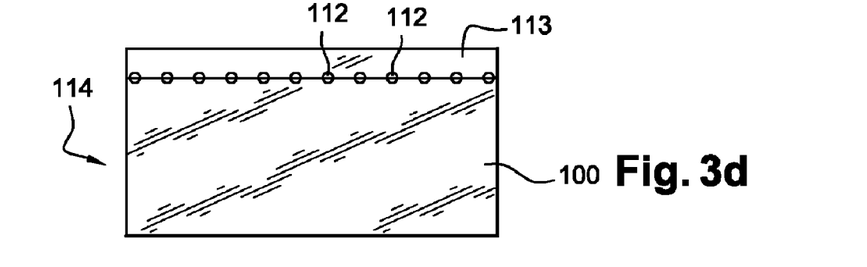

FIG. 3c illustrates the embodiment of an implantation of dopants 111 able to form P doping (typically an implantation of B, Ga or In in silicon), the implantation being carried out in the implanted area by species 112.

As mentioned above, the implantation process to be characterized is particularly defined by a mean penetration depth $Rp_{caract}$ and a maximum concentration at mean penetration depth $C_{caract}$.

By means of SRIM or Crystal-TRIM type computer simulation software, the mean penetration depth $Rp_{junction}$ corresponding to the implantation of species able to perform P type doping is determined by dichotomy such that this mean penetration depth $Rp_{junction}$ is substantially equal to the mean penetration depth $Rp_{caract}$ of the implantation process to be characterized (respect of condition 1 described above). Once this mean penetration depth $Rp_{junction}$ is determined, this same simulation software enables the implantation dose of species able to carry out P type doping to be defined such that the maximum concentration $C_{junction}$ (corresponding to the mean penetration depth $Rp_{junction}$) is greater than the maximum concentration $C_{caract}$ of the implantation process to be characterized.

It will be noted that the method according to the invention applies just as much by reversing the P and N dopings by starting with a P type substrate and by making an area implanted by dopants able to carry out N doping.

Figure 3E:
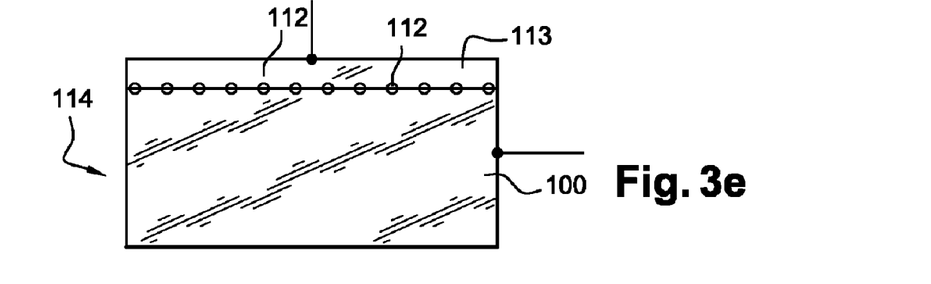

Once this double implantation is performed (FIGS. 3b and 3c), the crystallinity of the material should be restored; this is carried out by the thermal annealing illustrated in FIG. 3e. This thermal annealing also enables a redistribution of dopant atoms implanted during the step illustrated in FIG. 3c and therefore a modification of the doping profile by diffusion phenomenon. In addition, we note that this annealing also enables the electrical activation of the implanted dopant atoms by their passage to a substitutional site. Thanks to this annealing, a P type area 113 is obtained. This area 113 is, however, degraded by virtue of the presence of implanted species 112 that reduce the opportunities to place dopants 111 (that remain in the interstitial site) carrying out P doping in the substitutional site. Contrary to the first embodiment described with reference to FIGS. 1a to 1e, it will be noted that a degraded PN junction 114 is obtained here without going through producing an initial PN junction; this is due to the fact that the double implantation is carried out before the annealing activating the dopant species. However, this PN junction 114 remains a degraded PN junction with relation to the same PN junction obtained without species implantation by the process to be characterized. This degradation phenomenon effectively involves an increase in sheet resistance, resistivity or mobility of the degraded PN junction 114 with relation to the sheet resistance, resistivity or mobility of a PN junction obtained without species implantation by the process to be characterized.

FIG. 3e illustrates a step of measuring, for the degraded PN junction 114, a parameter representative of electrical conduction (typically sheet resistance with dispersion of said resistance on the surface of the wafer). This measurement allows a reference value (as well as the dispersion of this value on the wafer) of the degraded PN junction 114 to be obtained.

Typically, the invention starts with a plurality of blank wafers (FIG. 3a). At the time of reference, a degraded PN junction (FIG. 3b to FIG. 3d) is produced on one of these wafers by the implantation process that the invention seeks to characterize followed by implantation of dopant species followed by annealing. The sheet resistance of this first wafer as well as its dispersion are then measured (FIG. 3e). This measurement thus constitutes the reference value of the degraded PN junction 114 (the dispersion of this value on the wafer is also a reference value). It will be noted that the characterization method according to the invention applies to any type of implanted species and not exclusively to dopant species.

As the objective is to characterize the implantation process, the degradation and measurement step is repeated on another wafer at a time after the reference time (typically 1 day or 1 week later depending on the characterization frequency of the implantation process to be characterized). The new measurement of sheet resistance and dispersion on the degraded PN junction allows the evolution of sheet resistance and its dispersion to be followed in time with relation to the reference sheet resistance and dispersion. A deviation that is too large with relation to the reference values indicates a problem with the setting of one of the implantation parameters of the process to be characterized.

Generally, whatever the embodiment, sheet resistance, expressed in ohm/square, and its dispersion may be, for example, obtained in a known matter by a 4-point method such as described in the document "Measurements of sheet resistivity with the four-point probe," (F. M. Smits BSTJ—1958—p371) or by an SPV (Surface Photo Voltage), also called JPV (Junction Photo Voltage), method such as described, for example, in the document "Characterization of ultrashallow junctions using frequency-dependent junction photovoltage and its lateral attenuation" (Applied Physics Letters 89, 151123 (2006)).

The method according to the invention allows all "as-implanted" ion implantation processes to be characterized (the annealing utilized in the embodiments described above is only for producing the PN junction in the case of making the P or N area by implantation), whatever the implanted species, implantation parameters (species, energy, dose, tilt, twist, rotation and temperature of the material during the implant) and semiconductor material may be.

In order to know the sensitivity of the implantation parameters, it is useful to make nomograms for each implantation process by causing the parameter to be studied to vary by +10% and −10% with relation to the reference implantation process (i.e., that the invention seeks to be characterized). Doing this, one may determine if a deviation of the sheet resistance and/or its dispersion with relation to the reference sheet resistance or dispersion signifies a setting problem; In addition, this type of nomogram may allow the parameter that causes the setting problem to be identified as a function of the deviation value.

Of course, the device and process according to the invention are not limited to the embodiments that have just been described for indicative and in no way limiting purposes with reference to FIGS. 1 to 6.

In particular, even if the invention was more particularly described in the case of a sheet resistance measurement, it will be noted that it is also possible to measure, instead of sheet resistance, resistivity (expressed in Ohm.cm and that may also be obtained by a 4-point method or by an SPV method) or mobility (expressed in $cm^2/V.s$ and that may, for example, be obtained by a Hall effect technique, for example).

The invention claimed is:

1. A method of characterizing an ion implantation process, the method comprising:
   a first step of producing a PN junction degraded by the ion implantation of species, said species implantation being obtained by said ion implantation process to be characterized;
   a second step of measuring a parameter representative of an electrical conduction of said degraded PN junction and a dispersion of said parameter on a surface on which said degraded PN junction is produced, said parameter and said dispersion forming a reference parameter and a reference dispersion, said first and second steps being repeated in time so as to follow the evolution of the parameter representative of electrical conduction with relation to said reference parameter and the dispersion of the representative parameter with relation to said reference dispersion.

2. The characterization method according to claim 1, wherein said parameter representative of electrical conduction is given by a sheet resistance.

3. The characterization method according to claim 1, wherein the mean implantation depth of species is substantially equal to the depth of said degraded PN junction.

4. The characterization method according to claim 1, wherein the concentration of species implanted according to said ion implantation process to be characterized is strictly less than a concentration of dopants able to perform P or N doping in the implantation area.

5. The characterization method according to claim 1, wherein a substrate on which said PN junction is produced is an N-type substrate.

6. The characterization method according to claim 5, wherein the dopants able to perform P doping in the implantation area are boron atoms.

7. The characterization method according to claim 1, wherein said step of producing a degraded PN junction comprises:
   producing a non-degraded PN junction and then;
   implanting species obtained by said ion implantation process to be characterized in said non-degraded PN junction.

8. The characterization method according to claim 7, wherein said non-degraded PN junction is obtained by one of the following processes:
   ion implantation, in a substrate doped according to a first type of P or N doping, of dopants able to make a second type of doping that is opposite from said first doping type and then thermal annealing to activate the implanted dopant atoms;
   deposition by epitaxy, on a substrate doped according to a first type of P or N doping, of a layer doped according to a second type of doping that is opposite from said first doping type; or
   diffusion, in a substrate doped according to a first type of P or N doping, of dopant atoms according to a second type of doping that is opposite from said first doping type.

9. The characterization method according to claim 7, further comprising measuring a parameter representative of the electrical conduction of said non-degraded PN junction identical to said parameter representative of the electrical conduction of said degraded PN junction.

10. The characterization method according to claim 1, wherein said step of producing a degraded PN junction comprises:
    ion implantation, in a substrate doped according to a first type of P or N doping, of dopants able to make a second type of doping that is opposite from said first doping type and then;
    ion implantation of said species according to said ion implantation process to be characterized and then;
    thermal annealing to activate the implanted dopant atoms.

11. The characterization method according to claim 1, wherein said step of producing a degraded PN junction comprises:
    ion implantation, in a substrate doped according to a first type of P or N doping, of said species according to said ion implantation process to be characterized and then;
    ion implantation of dopants able to perform a second type of doping opposite from said first type of doping and then;
    thermal annealing to activate the implanted dopant atoms.

12. The characterization method according to claim 1, wherein said species implanted according to said ion implantation process to be characterized are non-dopant species.

* * * * *